United States Patent [19]

Stoddard

[11] Patent Number: 4,555,958
[45] Date of Patent: Dec. 3, 1985

[54] FLIP-DOWN PUSHBUTTON END CAPS FOR A RADIO TUNER

[75] Inventor: John P. Stoddard, London, England

[73] Assignee: Ford Motor Company, Dearborn, Mich.

[21] Appl. No.: 629,154

[22] Filed: Jul. 9, 1984

[51] Int. Cl.⁴ .......................... H03J 5/12; G05G 1/02
[52] U.S. Cl. .................................... 74/10.33; 16/123; 74/10.27; 74/503; 200/340
[58] Field of Search ............ 74/10.27, 10.33, 483 PB, 74/10.37, 503; 16/112, 123; 200/42 R, 340

[56] References Cited

U.S. PATENT DOCUMENTS 3,852,691 12/1974 Kell, Jr. et al. ...................... 334/19
3,906,806 9/1975 Harlan ................................ 334/7 X
4,464,549 8/1984 Fujita ............................... 200/42 R

FOREIGN PATENT DOCUMENTS 594130 5/1959 Italy ...................................... 16/123

Primary Examiner—Allan D. Herrmann
Attorney, Agent, or Firm—Paul K. Godwin, Jr.; Robert D. Sanborn

[57] ABSTRACT

Improved pushbutton end caps of a mechanical tuner pushbutton assembly for use on a radio receiver whereby a portion of each end cap is pivotable to two orthogonal orientations by manual depression on two defined areas displaced above and below the pivot axis to provide a flush face appearance to said radio when in their first orientation and to allow for station resetting when in their second orientations.

8 Claims, 9 Drawing Figures

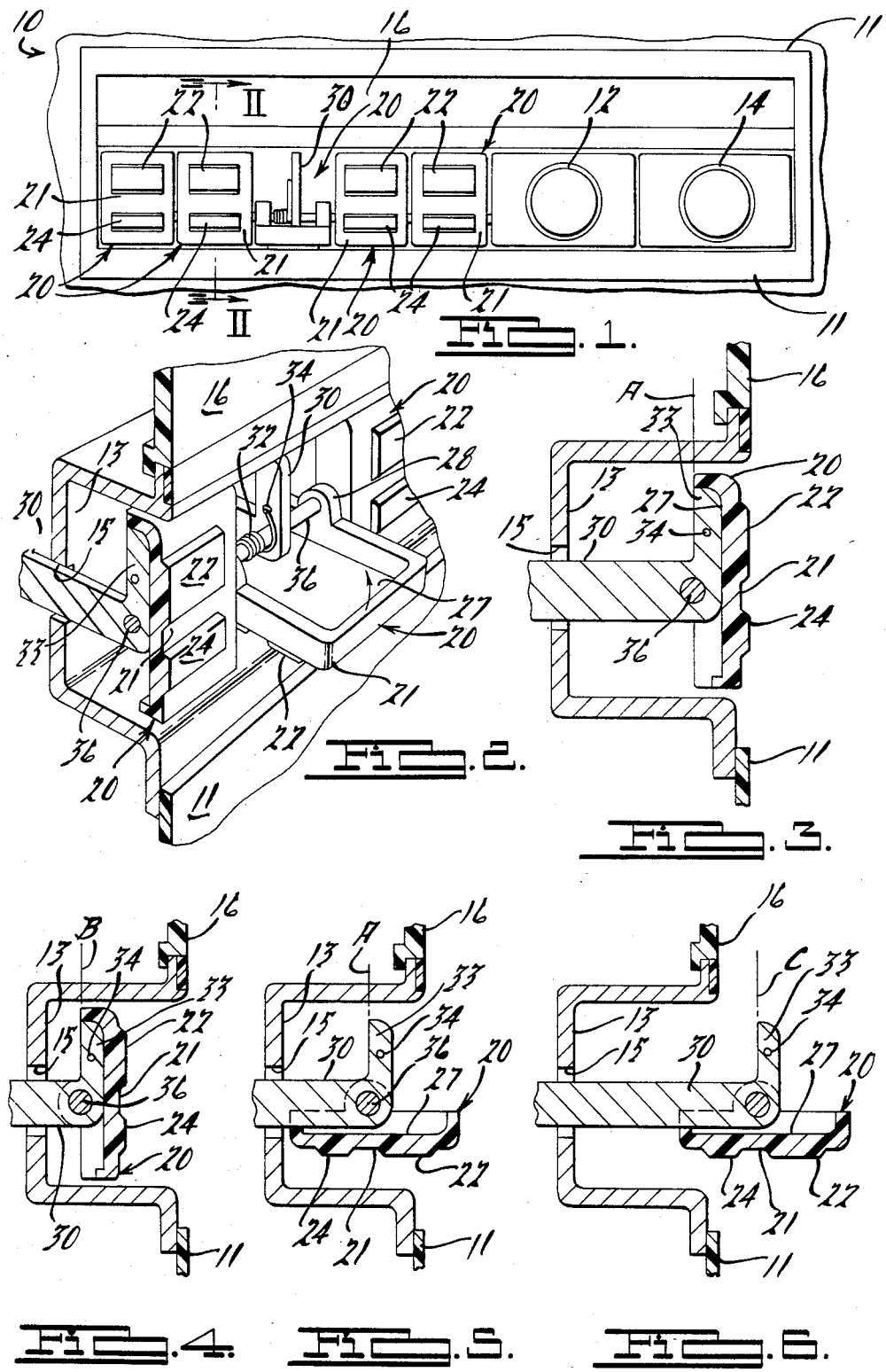

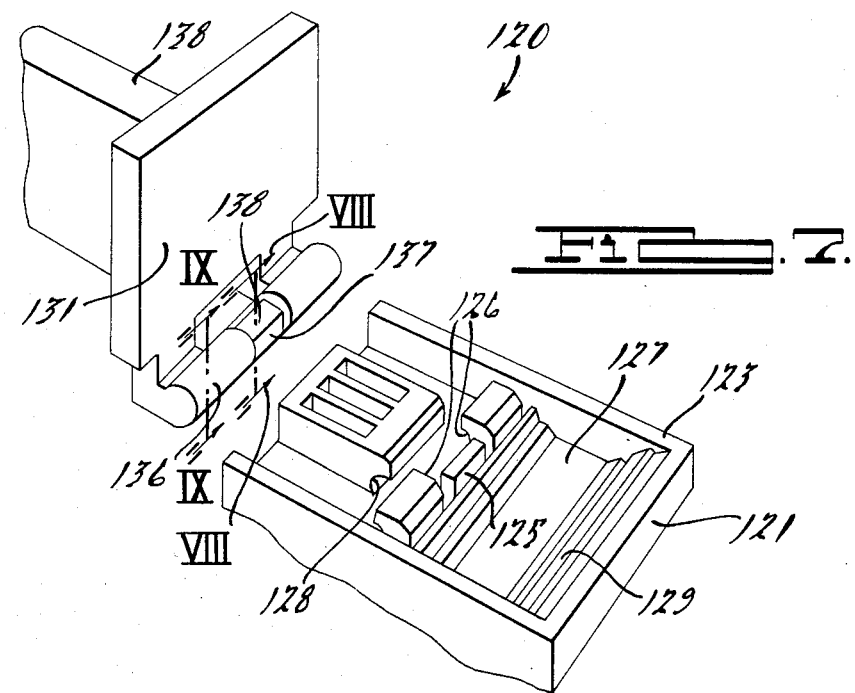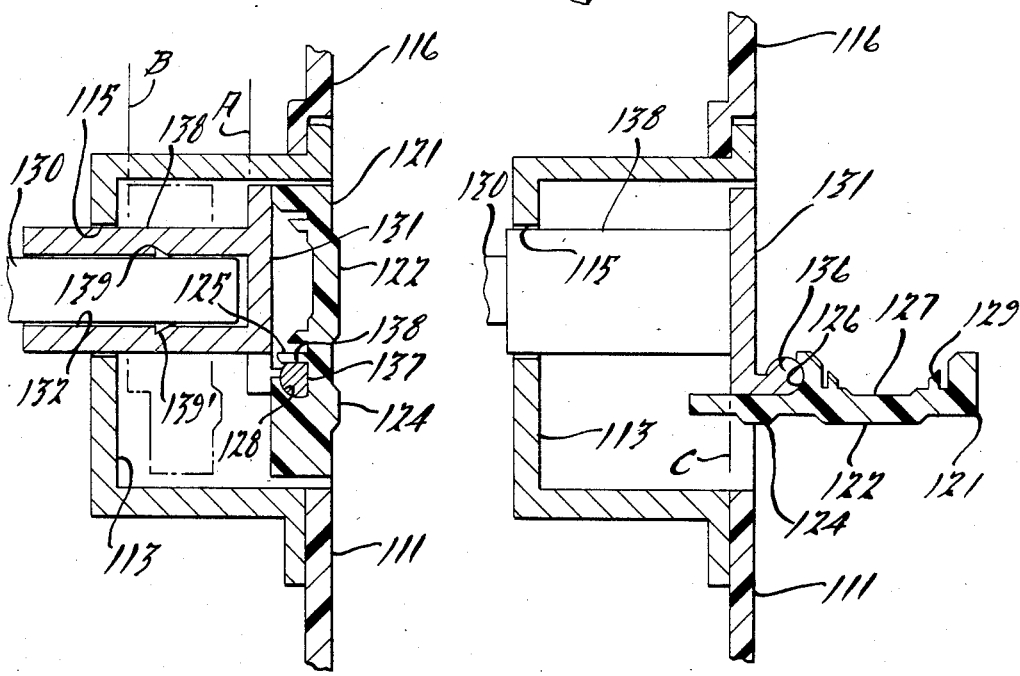

4,555,958

FLIP-DOWN PUSHBUTTON END CAPS FOR A RADIO TUNER

BACKGROUND OF THE INVENTION

1. Field of the Invention.

The present invention relates to the field of radio receiver mechanical tuner apparatus and more specifically to the area of mechanical tuner pushbutton assemblies.

2. Description of the Prior Art.

Several prior art patents, including U.S. Pat. No. 3,852,691, illustrate the typical arrangement in a manually actuated mechanical tuner pushbutton assembly as employed in a radio receiver. That assembly utilizes a plurality of depressible slides disposed across the front face of the radio receiver. The slide elements are disposed in a generally parallel arrangement and contain pushbutton end caps that extend outwardly from the ends of the slide elements for manual depression by the radio operator. Upon manual depression of the pushbutton end cap, the slide element is moved inwardly towards the tuner chassis until an associated locked cam mechanically reorients the internal tuning mechanism of the radio receiver to electrically select a particular reception frequency. Upon release of the pushbutton, an internal spring restores the slide element to its original position in which the cam remains locked. In order to reset a cam on the slide element to a new reception frequency, it is necessary to unlock the cam by pulling the pushbutton end cap away from the tuner chassis to a fully extended position. The tuning mechanism is then set, with a rotatable tuning knob, to a new reception frequency and the pushbutton is depressed until the unlocked cam is reset by the tuning mechanism to a new position and is then locked in that position by further inward movement of the slide element.

As such, conventional mechanical tuner pushbutton assemblies result in radio receivers that have pushbutton end caps with a relatively high profile extension from the front surface of the radio receiver in order to provide a gripping area for resetting.

In contrast, there is a tendency in the more expensive electronically synthesized tuning radio receiver design to provide a relatively flat front surface on the radio receiver with pushbutton switches that have a low profile extension from the front surface.

SUMMARY OF THE INVENTION

The present invention provides for an arrangement of pushbutton end caps which are suitable for use in mechanical tuner pushbutton assemblies to allow conventional functions of tuning and resetting the tuning cams with bi-directional movement of the associated slider. The unique configuration allows for a flat faced styling design in the radio receiver with pushbuttons that replicate the styling of electronically synthesized tuning radio receivers.

Each pushbutton end cap to the present invention may be mounted on a conventional slider element for bi-directional movement therewith about and away from a normal locked station deselect position to either a depressed locked station select position or a pulled unlocked position.

Each pushbutton end cap has a faceplate exposed for access by the operator. The faceplate is pivoted between a first orientation suitable for manual depression of the pushbutton and associated slider element to its locked station select position and a second orientation suitable for manual pulling of the pushbutton and associated slider element to its unlocked position to allow a new reception frequency to be selected for tuning by that pushbutton and slider element.

The faceplates of the pushbutton end caps, when in their first orientation, are parallel to the vertical plane of the front of the radio receiver and are preferably flush with the front surface. Each of the faceplates may be pivoted about an axis to a second orientation where it lies in a plane that is generally normal to the front of the radio receiver. In this second orientation, the faceplate presents an edge to the operator for pulling the pushbutton end cap and its associated slider to its unlocked position.

BRIEF DESCRIPTION OF THE DRAWINGS

FIG. 1 is a plan view of a radio receiver incorporating the present invention.

FIG. 2 is a partial cross-section perspective of a pushbutton assembly incorporating the present invention.

FIG. 3 is a cross-sectional view of the present invention showing the pushbutton end cap in its first orientation in its normal locked station deselect position flush with respect to the front surface of the associated end radio receiver.

FIG. 4 is a cross-sectional view of the present invention showing the pushbutton end cap and its associated slider element, in its first orientation and manually depresseo to its locked station select position.

FIG. 5 is a cross-sectional view of the present invention showing a pushbutton end cap and its associated slider element flipped to its second orientation for manual pulling from its normal position.

FIG. 6 is a cross-sectional view of the present invention showing the pushbutton end cap of FIG. 5 pulled to its unlocked position.

FIG. 7 is an exploded perspective view of a second embodiment of the present invention.

FIG. 8 is a cross-sectional view of the second embodiment in its first orientation taken along lines VIII—VIII in FIG. 7.

FIG. 9 is a cross-sectional view of the second embodiment in its second orientation taken along lines IX—IX in FIG. 7.

DETAILED DESCRIPTION OF THE PREFERRED EMBODIMENTS

The front of a radio receiver 10 is shown in FIG. 1 which employs the present invention. A front surface bezel 11 surrounds the control knobs 12 and 14 and pushbuttons 20 of the radio receiver 10. A transparent window 16 is provided to protect a visible display that indicates station tuning in a conventional analog or digital manner. Volume and station selection knobs 12 and 14 are also provided and function in a conventional manner. In this embodiment, five pushbutton end caps 20 are shown located adjacent to the volume and tuning knobs 12 and 14. The front faceplates 21 of the pushbutton end caps 20 are normally oriented so as to provide a generally flush or flat face surface appearance to the radio receiver. However, the center pushbutton end cap of FIGS. 1 and 2 is shown in its flipped-down orientation.

Each pushbutton end cap 20 is attached to a slider 30, which is modified at its outer end for mounting the pushbutton end caps 20. The slider element 30 extends through an aperture 15 in a recessed portion of the housing 13. The remainder of the slider element 30 (not shown) may be of a conventional nature with locking cams and mounted for bidirectional movement as described in the aforementioned prior art.

Each slider element 30 in this embodiment, is modified to provide a pushbutton stop 33, a hinge pin 36 and a spring retainer hole 34. Each pushbutton end cap faceplate 21 is mounted onto its hinge pin 36 with apertured extensions 28 for pivoting about the axis of the hinge pin 36. The inner cavity 27 of each pushbutton end cap 20 is designed to abuttingly mate with the front surface of the pushbutton stop 33 so as to provide a pivot limit and a reactive surface when the pushbutton is manually depressed. A major depression pad area 22 is defined on the front surface of the faceplate 21 above the hinge axis and in line with the longitudinal movement direction of the slider element 30 so as to indicate the area of preferred manual contact for achieving pushbutton depression. A minor depression pad area 24 is defined on the front surface of the faceplate 21 below the hinge axis to define the preferred manual contact area for causing the faceplate to flip-down to its second orientation.

A coil spring 32 is shown in FIGS. 1 and 2 as providing a biasing force between the lower portion of the inner cavity 27 of each pushbutton end cap 20 and the associated pushbutton stop 33, in order to bias each end cap 20 in its normal upright orientation. Of course, the spring 32 can be eliminated if it is more desirable to allow the caps to stay in their flipped down orientation. However, it would then be necessary to provide a friction lock between the pushbutton stop 33 and the contacting surface of inner cavity 27 when each end cap 20 is in its upright orientation.

In FIG. 4, a cross-section of a typical pushbutton is shown in its locked station select position "B" that is caused by manual depression against major depression pad area 22.

FIG. 5 illustrates the slide element 30 in its normal locked station deselect position "A" with the pushbutton end cap 20 in its second orientation caused by a manual depression on the minor depression pad area 24 when the pushbutton was in the first orientation, as shown in FIG. 3.

FIG. 6 illustrates the slider 30 in its unlocked position "C" caused by manual pulling of the pushbutton end cap 20 outwardly from the front face of the receiver 10. It can be seen in FIG. 6 that the recess cavity 27 in the pushbutton end cap 20 provides a gripping edge to facilitate manual gripping of the end cap.

The first embodiment of the invention shown in FIGS. 1-6 provides for a substantially flat surface appearance in pushbutton design and, by utilizing the unique flip-down mechanism, allows for station reselection.

A second embodiment of the present invention as shown in FIGS. 7-9 as a two-piece plastic molded end cap 120 that is retained on a conventional slider element 130. In that embodiment, an end cap sleeve 138 is configured with an open longitudinal aperture 132 that is slightly larger in cross-section than the slider element 130. Once the end cap sleeve 138 is slid over the slider 130, it is permanently retained by barbs 139 and 139' which extend outwardly from the edges of the slider 130.

A baseplate 131 is formed on the closed end of the sleeve 138 to provide a depression surface against which the hinged faceplate element 121 is retained in its first orientation. At the lower end of the baseplate 131, a hinge pin 136 is formed to define the axis of pivoting for the faceplate 121.

The faceplate 121 is a separately molded piece that from the front surface appears similar to the first embodiment having a substantially flat surface with two defined major and minor depression pad areas 122 and 124. However, on the backside of the faceplate 121, the mounting and biasing mechanisms are somewhat different. Hinge capturing tabs 126 and 128 are formed on the backside of the end cap 121 so as to ride on the cylindrical surface of the hinge pin 136 when the pieces are mated. The hinge pin 136 has a vertical surface 137 and a horizontal surface 138 formed thereon to provide biasing of the faceplate 121 in either of its first upright orientation as shown in FIG. 8, or its second flip-down orientation as shown in FIG. 9. In addition, a biasing tab 125 is formed between capturing tabs 126 to seek a flat mating with either the vertical surface 137 as shown in FIG. 9 or with the horizontal surface 138 as shown in FIG. 8, depending upon the direction of imbalance forces occurring about the corner formed by the vertical and horizontal surfaces 137 and 138. In FIG. 8, it can be seen that in the normal locked station deselect position "A", the front surface of the faceplate 121 is substantially flush with the bezel 111 on the front of the radio receiver. Upon receiving manual depression forces on the major depression pad area 122, the pushbutton is moved towards the rear of the cavity 113 on slider element 130 extending through aperture 115 to its locked station select position "B". When the pushbutton is released, it is restored to its normal "A" position. When one depresses the minor depression pad area 124, below the hinge pin 136, and overcomes the biasing forces of biasing tab 25, the faceplate 121 will flip-down to its second orientation thereby exposing ridges 129 in the back cavity 127. These ridges 129, along with the back edge 123, are suitable for gripping the faceplate 121 and pulling it along with the slide element 130 to its unlocked position "C".

It will be apparent that many modifications and variations may be implemented without departing from the scope of the novel concept of this invention. Therefore, it is intended by the appended claims to cover all such modifications and variations which fall within the true spirit and scope of the invention.

I claim:

1. In a radio tuner assembly which includes a plurality of slider elements each disposed on the front thereof for bi-directional longitudinal movement about and away from a defined normal locked station de-select position to a defined locked station select position or to a defined unlocked position;

a pushbutton means disposed on each slider element for movement therewith and having a face plate that is pivotal between a first orientation suitable for manual depression of the corresponding pushbutton and the slider element to its defined locked station select position and a second orientation suitable for manual pulling of the corresponding pushbutton means and the slider element to the defined unlocked position.

2. An assembly as in claim 1, wherein said front of said radio has a generally planar surface configuration and each faceplate has an outer surface which, in its first orientation, lies in a first plane that is generally parallel to and flush with said front surface of said radio and in its second orientation said outer surface lies in a second plane which is generally orthogonal to said first surface of said radio.

3. An assembly as in claim 2, further including a hinge means between said slider element and said faceplate which provides a pivotal axis of rotation for said faceplate between its first and second orientations.

4. An assembly as in claim 3, wherein said pushbutton means includes spring means for biasing said faceplate toward its first orientation.

5. An assembly as in claim 3, further including spring means for biasing said faceplate towards its second orientation when said faceplate is pivoted to said second orientation and until such time as sufficient force is supplied to overcome said spring means bias.

6. An assembly as in claim 4, wherein said hinge means includes a cylindrical pin; and said spring means includes a flat cam face formed on a portion of said cylindrical pin and a resilient cam follower mounted on said faceplate and having a flat follower surface that seeks to mate with the flat cam surface on said cylindrical pin.

7. An assembly as in claim 5, wherein said hinge means includes a cylindrical pin; and said spring means includes two flat cam faces, that lie in orthogonally disposed planes to define a corner edge, formed on a portion of said cylindrical pin and a resilient cam follower on said faceplate having a flat follower surface that rides over said corner edge and seeks to mate with one of said two flat cam faces when said faceplate is pivoted towards respective first or second orientations.

8. An assembly as in claim 3, wherein said hinge means is disposed between said slider element and said faceplate to provide the pivotal axis of rotation for said faceplate offset from the center of the faceplate so as to define a major depression area and a minor depression area on the outer surface of said faceplate, whereby manual depression forces applied against said major depression area, when said faceplate is in its first orientation, causes said pushbutton means and said slider element to move towards the locked station select position and whereby manual depression forces applied against the minor depression area, when said faceplate is in its first orientation, causes said faceplate to pivot to its second orientation.

* * * * *